United States Patent [19]

Evanchuk

[11] 4,441,096
[45] Apr. 3, 1984

[54] OPTICAL ANALOG-TO-DIGITAL CONVERTER

[75] Inventor: Vincent L. Evanchuk, Sherman Oaks, Calif.

[73] Assignee: California Institute of Technology, Pasadena, Calif.

[21] Appl. No.: 407,830

[22] Filed: Aug. 13, 1982

Related U.S. Application Data

[63] Continuation of Ser. No. 161,934, Jun. 23, 1980, abandoned.

[51] Int. Cl.³ .............................................. H03K 13/02
[52] U.S. Cl. .............................. 340/347 AD; 250/204; 250/205; 340/347 M; 356/222; 356/235
[58] Field of Search ....................... 340/347 M, 347 P; 250/204, 205; 356/222, 230, 235

[56] References Cited

U.S. PATENT DOCUMENTS 3,599,545 8/1971 Durr et al. ...................... 356/235 X
4,276,543 6/1981 Miller et al. .................. 340/347 AD

OTHER PUBLICATIONS

The Engineering Staff of Analog Devices, Inc., Analog–Digital Conversion Handbook, 6/1972, pp. II-46 to II-48; II-80 to II-83.

*Primary Examiner*—T. J. Sloyan
*Attorney, Agent, or Firm*—Freilich, Hornbaker, Wasserman, Rosen & Fernandez

[57] ABSTRACT

A method and apparatus for converting the intensity of an unknown optical signal (B) into an electrical signal in digital form utilizes two elongated optical attenuators (11, 13), one for the unknown optical signal from a source (10) and one for a known optical signal (A) from a variable source (12), a plurality of photodetectors (e.g., 17, 18) along each attenuator for detecting the intensity of the optical signals, and a plurality of comparators (e.g., 21) connected to the photodetectors in pairs to determine at what points being compared the attenuated known signal equals the attenuated unknown signal. The intensity of the unknown relative to the known is thus determined by the output of a particular comparator. That output is automatically encoded to a relative intensity value in digital form through a balancing feedback control (24) and encoder (23). The digital value may be converted to analog form in a D-to-A converter (27) and used to vary the source of the known signal so that the attenuated intensity of the known signal at a predetermined point (comparator 16) equals the attenuated intensity of the unknown signal at the predetermined point of comparison. If the known signal is then equal to the unknown, there is verification of the analog-to-digital conversion being complete. Otherwise the output of the comparator indicating equality at some other point along the attenuators will provide an output which is encoded and added, through an accumulator comprised of a register (25) and an adder (26), to a previous relative intensity value thereby to further vary the intensity of the known signal source. The steps are repeated until full conversion is verified.

8 Claims, 2 Drawing Figures

OPTICAL ANALOG-TO-DIGITAL CONVERTER

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

This is a continuation of application Ser No. 161,934, filed June 23, 1980, now abandoned.

BACKGROUND OF THE INVENTION

This invention relates to a method and apparatus for conversion of the intensity of an optical signal into an electrical signal in digital form.

Conversion of an analog signal into a digital form is sometimes carried out by programmed algorithms in a digital computer which offer fast and accurate conversion, but require a computer. Discrete hardware converters are more often used as a peripheral device coupling an analog signal into a digital computer. Such hardware converters have taken several forms. One form, called an integrating A-to-D converter, generates a voltage ramp from a train of digital pulses integrated by an operational amplifier. When the voltage ramp reaches agreement with the analog signal, its value in the form of a binary-coded count of the pulses constitutes a conversion of the analog signal in digital form. If necessary the gain of the operational amplifier may be altered by a scale factor ranging switch.

Double voltage ramps are sometimes used in converters, requiring more circuit complexity. In the double ramp type of converter the analog input signal is integrated for a predetermined time. Then a reference signal is switched to the integrator and integrated 'down' so as to discharge the voltage stored in the integrator. The time required to discharge the stored voltage is taken as a measure of the input signal's magnitude. The magnitude is expressed in digital form by counting clock pulses during the time the stored voltage is being discharged.

In some converters, the magnitude of the analog input signal is stored in a 'sample-and-hold' circuit. A counter having its output terminals connected to an analog-to-digital converter is then incremented until the magnitude of the analog signal generated equals the stored signal. This type of counter works well and is inexpensive, but the maximum converting rate is well below the frequency response of the transistors used in the circuitry. For faster conversion, a register is used into which a binary 1 is stored sequentially in each binary digit (bit) position in response to clock pulses, starting with the most significant bit position. A digital-to-analog converter immediately converts the value of the binary number thus stored, and if it exceeds the input analog signal, the last binary 1 stored is changed to a binary 0 at the same time a binary 1 is stored in the next less significant bit position. This successive approximation method has the advantage of completing a conversion in a number of clock pulse periods equal to the number of bits in the register. This is of particular advantage to a computer programmer who must allow sufficient time for a conversion process.

Still other conversion methods are known and commonly used, but each is directed to the problem of converting an electric analog signal to digital form using all electronic circuits. It would be desirable to use an optical circuit to convert a signal into digital form, particularly when the signal is an optical intensity signal. Optical circuits offer the advantage of freedom from induced noise and crosstalk, voltage isolation, and also input/output branching capabilities of literally hundreds of connections. By incorporating a balancing feature in an optical analog-to-digital converter which uses the natural attenuation of light in a medium to achieve a large dynamic range, the number of sequential steps required to complete a conversion can be reduced to virtually two: comparison and verification, where the comparison is with the speed of light and verification is complete in the few nanoseconds an electronic circuit requires to close the loop and adjust a reference light source.

SUMMARY OF THE INVENTION

In accordance with the present invention, an analog electrical signal converted to an optical signal, or an unknown optical signal, is compared with a known optical signal from a known variable source for the purpose of converting the unknown optical signal to an electrical signal in digital form using a separate light attenuating path for each optical signal, and detecting the intensity of light at points along the separate attenuating paths to determine at which points on the separate paths the light intensity in the path for the unknown optical signal is substantially equal to the known optical signal along the path for the known signal. The determination is made by one set of comparators connected to two sets of photodetectors spaced at relative points along the attenuating paths, one comparator for a photodetector of one set paired with a photodetector of the other set. The output of the comparator indicating equality is a measure of intensity of the unknown relative to the known. That measure is encoded for a digital output. Thus, for $2^n$ comparators, one comparator output produces a digital signal that may be converted directly into a binary code of n bits. Such a method would have the advantage of total electrical isolation between the unknown signal and the reference.

The digital output may be converted to analog form to vary the known signal source so that the known and the unknown optical signals are substantially equal at relative points where they have travelled through the same attenuating distances. If that state of equality has not been reached by the first cycle of conversion, the process is repeated, and the relative intensity value in digital form produced by the next conversion cycle is added to the previous relative intensity value, until the state of equality has been reached at a predetermined balance point. The sum of accumulated relative intensity values thus yields a digital output that is a measure of the unknown optical signal relative to a predetermined value of the known signal intensity. An advantage of such a feedback and balance technique is that conversion to an accuracy of one part in $2^n$ can be realized with much fewer than $2^n$ comparators.

The sets of photodetectors may be extended beyond the balance point on the reference attenuator path in order to provide signals to balancing feedback control means from points where equal intensity of the unknown and known signals indicates the signal in the reference path has driven the equality point past the midpoint, in which case a digital signal proportional to the distance from the balance point is commanded to be subtracted, such as by adding a negative digital signal to a previous sum. Balance may thus be achieved from either side of the balance point. Equality at the balance point commands that zero be added to the value in the storage means. The ADD ZERO command is detected to verify that conversion has been completed. This verification may be indicated by setting a bistable means which in turn disables the sum of accumulated digital signals from being altered until the bistable means is reset to begin another conversion cycle. Upon resetting the bistable means, a register for storing the sum is cleared to begin a conversion cycle from a condition where the known optical signal is a minimum.

The novel features that are considered characteristic of this invention are set forth with particularity in the appended claims. The invention will best be understood from the following description when read in connection with the accompanying drawings.

Reference will now be made in detail to preferred embodiments of the invention, an example of which is illustrated in the accompanying drawings.

DESCRIPTION OF PREFERRED EMBODIMENTS

In accordance with the invention, comparison of an unknown optical signal with a known optical signal is achieved for analog-to-digital conversion of the unknown signal by using two elongated optical attenuators comprised of the same light conducting medium, one for each of the unknown and known optical signals with two sets of photodetectors, one set for each attenuator spaced along the attenuator. Light proceeding along the path of each attenuator follows the inverse-square law; that is, the intensity of light conducted is attenuated proportionately with the square of the distance from the source. This can be used to make a direct conversion of the unknown optical signal to digital form by comparing the light intensity at points along the attenuators to find the furthest point along the unknown signal attenuator at which the light intensity of the unknown signal is equal to or less than light intensity of the known. This information of relative intensity is, upon encoding into digital form, a first approximation of the conversion of the analog optical signal to digital form. Balancing feedback control means is connected to comparators of signals from photodetectors to cause a digital signal proportional to the distance from the unknown source to be added to a value in digital form stored in a storage means, and the sum replaces the value stored in the storage means, whereupon the value in digital form converted to analog form drives the known source to increase its intensity. The process is immediately repeated to further increase the intensity until comparison shows equality at some balance point in the attenuators, normally an equal distance from their light sources for conductors of matched attenuating characteristics.

Figure 1:
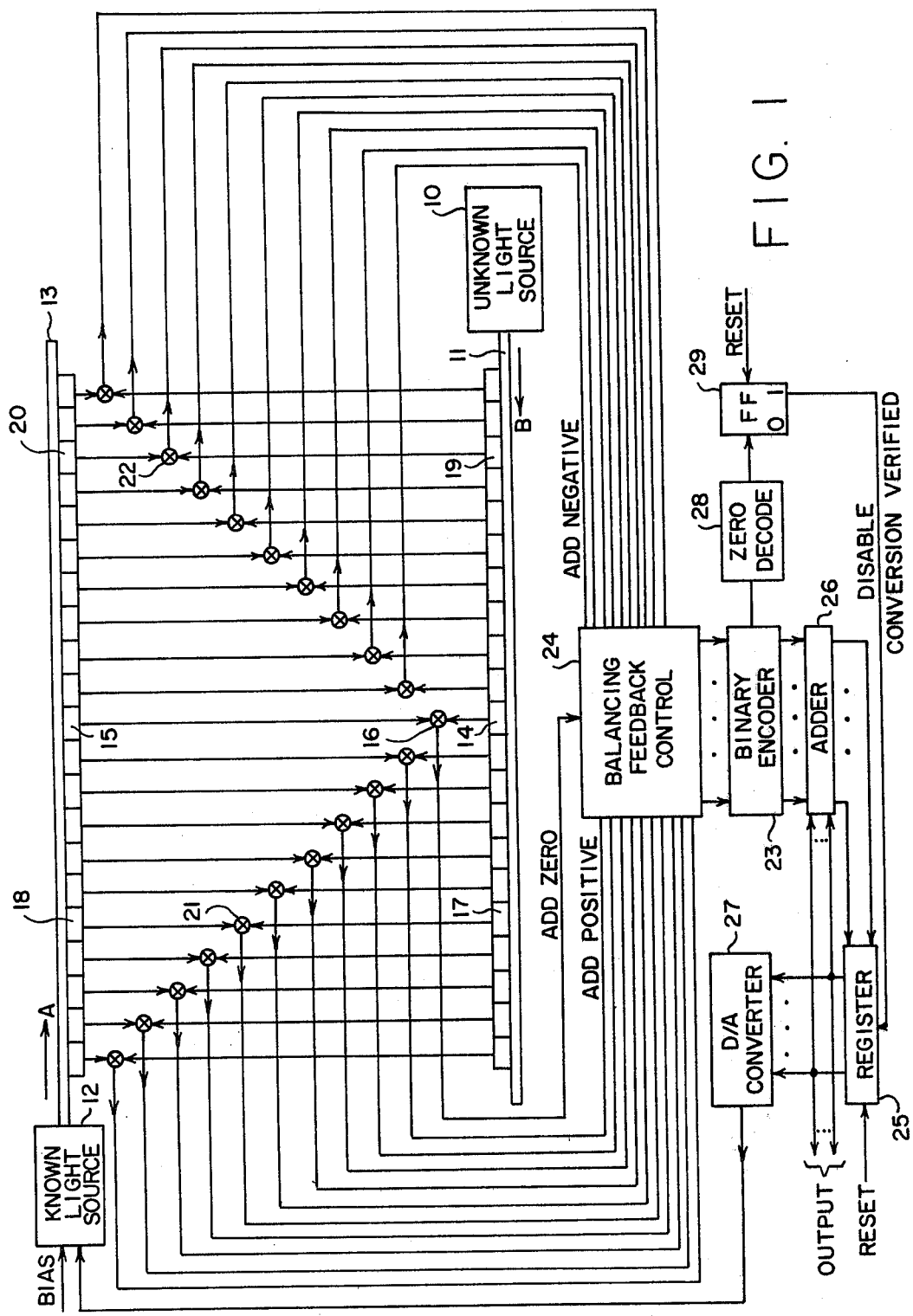
FIG. 1 is a schematic diagram of a preferred embodiment of the invention.

In FIG. 1 of the drawings, the unknown optical signal emanating from a light source 10 is optically coupled to an elongated optical conductor 11, while the known optical signal emanates from a known (reference) source 12 coupled to a similar elongated optical conductor 13. Each source may be any light emitting device, but in practice the reference source is preferably a light emitting diode which emits light of an intensity proportional to the amplitude of a voltage applied to it over a useful range, and the unknown source 10 is a device that emits light of substantially the same spectral characteristics, preferably also a light emitting diode of the same type as the reference source. If the light conductors attenuate the light roughly equally, and the sources are fairly well matched, then there will be a midpoint where the light intensity in one conductor is the same as in the other. Photodetectors 14 and 15 at the midpoint would produce the same output voltages, and a comparator 16 connected to those photodetectors would indicate no difference. The two photodetectors may be phototransistors in a differential input stage to a saturating operational amplifier which functions as the comparator.

Photodetectors are spaced along both conductors on both sides of the midpoint, as shown. If, for example, photodetectors 17 and 18 indicate equal light intensities, it follows that the unknown light source has an intensity quite large in comparison to the reference, so it is necessary to increase the intensity of the known light source 12. On the other hand, a balance between photodetectors 19 and 20 indicates that the intensity of the reference is much larger than the intensity of the unknown light source 10, so it is necessary to reduce the intensity of the known light source until a balance is achieved at the midpoint. However, balance at the midpoint is only a matter of convenience. A balance at any other point indicates the relative magnitudes of the unknown and known light sources, provided the attenuation characteristics of the two light conductors are accurately known. For example, a balance at the photodetectors 17 and 18 could indicate that the unknown light source is of an intensity 3.0 decibels greater than the intensity of the known light source. (Because of the inverse-square law, the scale along the conductors is logrithmic, and not linear, so it is convenient to calibrate on a decibel scale.) A balance at a comparator 21 could then be labeled "3.0 dB greater." Similarly, if a balance occurs at a comparator 22, that would indicate that the unknown light source is 4.0 dB less than the known light source 12. So if the reference source 12 is of a constant and known intensity, a direct conversion of the relative intensity of the unknown light source could be made by a suitable encoder of the diode matrix type having a number, n, of horizontal electrical conductors for an n-bit code and one vertical electrical conductor for each comparator, with diodes at the intersections of the horizontal and vertical lines for the proper codes indicating the relative intensity of the unknown optical signal indicated by a balance at any of the respective vertical lines.

The accuracy of this direct analog-to-digital conversion is affected by the light scattering characteristics of each conductor. Since the photodetectors face into the conductors from outside at right angles, they respond to scattered light. Any local change in scattering and/or attenuation in the conductors can cause a departure from the true square-law response. That would degrade the accuracy of the analog-to-digital converter. Consequently, a continuous array of photodetectors and comparators, along the lengths of the two conductors, as shown, would have some minor inaccuracies.

These inaccuracies could be calibrated and a correction applied to the output of each comparator, but calibration and correction of each converter produced would require great expenditure of applied labor. For that reason, the output of each comparator is used only to increase, or decrease, the intensity of the known light source 12 to equal the intensity of the unknown light source 11 within the accuracy inherent in the particular comparator. Any difference would then be detected by a comparator closer to the midpoint. The unknown light source is again adjusted, and the process repeated until the known and the unknown are equal within the range of difference that would produce an output from the comparator on either side of the midpoint comparator. Thus an indication that a balance exists at comparator 21 would produce a 3.0 dB increase in the intensity of the known source 12. If balance now exists at the midpoint, the output signal from comparator 16 would terminate the conversion process, and the accuracy of the first balance is thus verified. If the new balance were instead at a point 0.5 dB from midpoint, then the intensity of the known source would again be increased or decreased, as the case may be, by 0.5 dB and a new comparison made.

From the foregoing it is seen that the most important portion of the array is the midpoint; it would be the only point requiring calibration. That calibration could be easily performed by switching the reference on with a standard light source in place of the unknown, and adjusting a bias voltage on the known light source accordingly. If care is taken in manufacturing the conductors 11 and 13, and in matching of the light emitting diodes, then the conversion process could be held to a very few steps. Manufacturing the entire device by photolithographic techniques as in conventional integrated circuits and in optical circuits as described in a copending application Ser. No. 138,165 filed Apr. 7, 1980 by the same inventor, would yield a miniature, inexpensive converter with precise control of manufacturing tolerances.

Present light-emitting diodes are capable of a dynamic range of about 40 dB. Thus a signal range greater than this would have to be accommodated by a range-changing switch. Similarly, a signal range less than this may be decreased for greater accuracy using the range-changing switch, a practice found in many conventional analog-to-digital converters. The frequency response is currently up to a high multiple megahertz; this, combined with the fewer steps in this system yields a high-speed converter. The current resolution of optical light-intensity comparisons indicates that differences as small as 0.05 dB can be detected, which is likely to be smaller than the least significant data bit in most systems.

The output of each comparator is easily coded, such as by a binary encoder 23, using a diode matrix as described above, to provide a balancing feedback via a control unit 24 to be described with reference to FIG. 2. The output of the comparator at midpoint is coded to provide a binary zero to indicate a balance, and thus verify that conversion is complete. In the control feedback loop, that output also constitutes a command ADD ZERO. The output of other comparators are coded to indicate how much the intensity of the known source should be increased, or decreased to achieve a balance. Each of the outputs of the comparators to the left of midpoint constitute a command to the feedback loop to add the encoded positive digital value of the active comparator output, i.e., to ADD POSITIVE. Similarly, each of the outputs of the comparators to the right of midpoint constitute a command to the feedback loop to add the encoded negative digital value of the active comparator output, i.e., to ADD NEGATIVE. The commands ADD POSITIVE and ADD NEGATIVE are implied in the signs of the encoded digital outputs of the encoder 23. If there are no inaccuracies, the next comparison following an ADD POSITIVE output from a comparator to the left of midpoint, or an ADD NEGATIVE from a comparator to the right of midpoint, is an ADD ZERO from the midpoint comparator.

The output of the binary encoder 23 is added to the content of a register 25 via an adder 26. (The register is reset to zero at the beginning of each conversion cycle.) In practice, these digital circuits may be synchronized to operate at some suitable clock rate, such as $10^8$ clock pulses per second.

The sum is stored in the register which, together with the adder, functions as an accumulator. The output of the register 25 is in turn converted to analog form in a D-to-A converter 27, and there added to the bias applied to the known light source 12. This will increase, or decrease, the intensity of the known light source to bring it into balance at the midpoint comparator 16. If not, the process is repeated until balance is achieved at the midpoint, usually in the second step. Balance at the midpoint produces a binary number equal to zero which is detected by a zero decoder 28 that sets a flip-flop 29 to disable the register 25, thus completing a conversion cycle. (To begin a new cycle, the register and flip-flop are reset at the same time.) Once the flip-flop is set, its true (1) output terminal signals that conversion has been verified. The content of the register at that time is a digital value of the unknown light source. From that and the initial calibrated output of the known light source, the absolute intensity of the unknown may be determined if necessary.

If the response of the converter is much faster than the changes in the unknown light source, the system need not be synchronized with clock pulses applied to the digital circuits, namely the binary encoder 23, adder 26 and register 25. The delays through those digital circuits would be about 3 to 10 nanoseconds, which would easily allow for samples at $10^8$ per second. In some applications, the flip-flop 28 may be omitted in order for the converter to be free running, thereby to continually provide digital conversion of a varying unknown light source.

Figure 2:
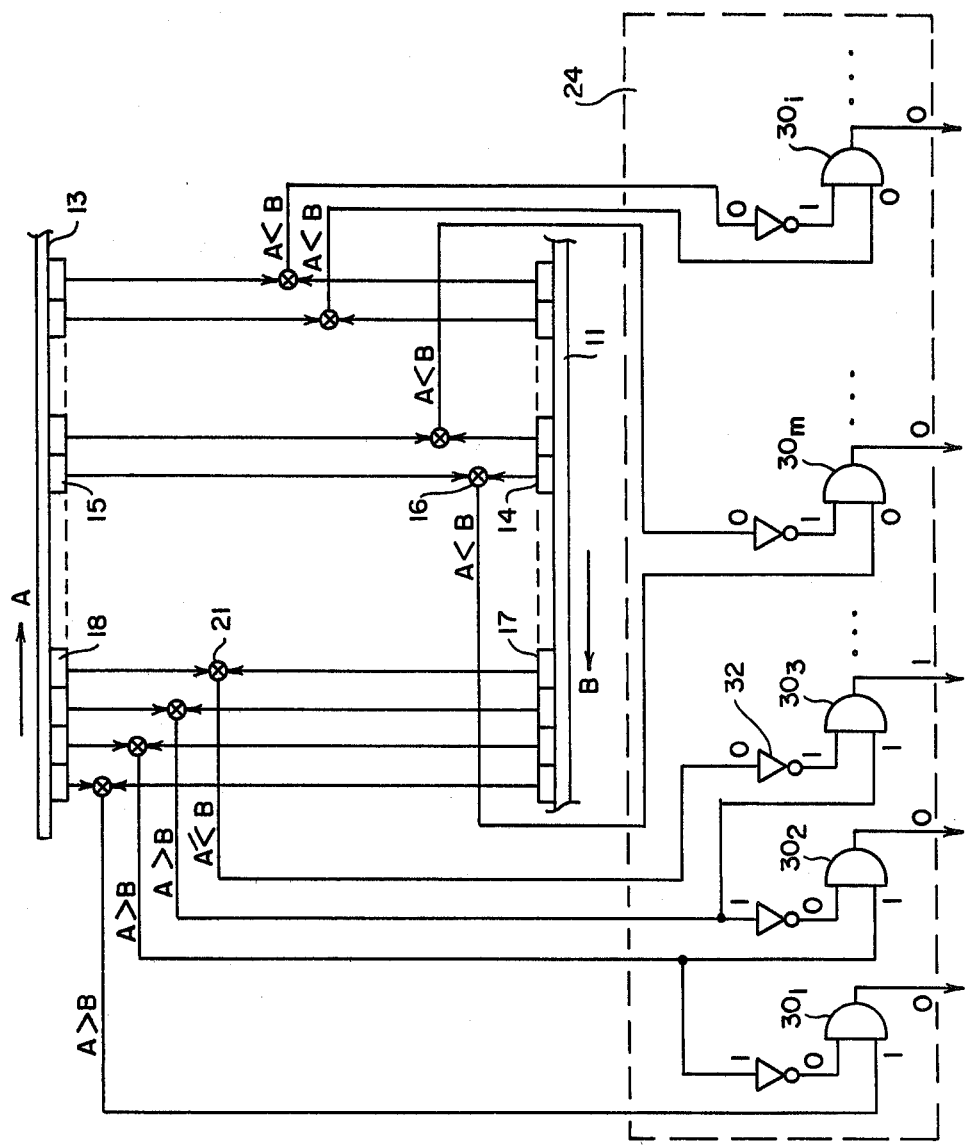
FIG. 2 is a schematic diagram of an exemplary implementation of balancing feedback control for the embodiment of FIG. 1.

Referring now to FIG. 2, there are shown portions of the light conductors (attenuators) 11 and 13, with some comparators connected to photodetectors. The rest of the photodetectors and comparators shown in FIG. 1 are omitted for convenience since the symmetry of the balancing feedback control unit 24 will allow one skilled in the art to fill in the rest of the photodetectors and comparators.

The balancing feedback control unit 24 is comprised of a plurality of AND gates $30_1, 30_2, 30_3, \ldots 30_m \ldots 30_i$, one AND gate for each comparator, which is enabled whenever the unknown signal, A, at the position of photodetectors connected to the comparator exceeds the known (reference) signal, B. Each AND gate is inhibited from transmitting a bit-1 signal whenever the next comparator further downstream on the reference attenuator 13 also emits a bit-1 signal, indicating that the known signal A exceeds the unknown signal B. Only one AND gate will emit a bit-1 signal, that being the AND gate connected to the last comparator with a signal indicating that the known signal A exceeds the unknown signal B, starting at a comparator associated with a photodetector next to the known (reference) light source. The next downstream comparator on the conductor 13 (comparator 21 in the illustration shown in FIG. 1) emits a bit-0 signal that is inverted to a bit-1 signal by an inverter 32 so that the AND gate $30_3$ emits a bit-1 signal. All other AND gates associated with comparators further downstream on the conductor 13 will emit a bit-0 because the noninverted signals to them are bit-0 signals. In that manner, the balancing feedback control circuit 24 will provide a bit-1 signal at only the one output terminal that is connected, through an inverter, to the first comparator down the reference conductor 13 that indicates the known signal A is not greater than the unknown signal B, which is to say $A \leq B$.

Although particular embodiments of the invention have been described and illustrated herein, it is recognized that modifications and variations may readily occur to those skilled in the art. For example, instead of straight optical conductors, two spiral conductors may be provided, side by side, for a more compact package, particularly when conductors of sufficient length of $2^4$ comparators are provided for direct conversion into a 4-bit binary code. Consequently, it is intended that the claims be interpreted to cover such modifications and equivalents.

What is claimed is:

1. A method for analog-to-digital conversion of an unknown optical signal into an electrical signal in digital form by comparison with a known optical signal comprising the steps of transmitting the known and unknown optical signals separately through two displaced and parallel light paths of substantially equal attenuation per unit length, independently detecting the intensity of light along said two light attenuating paths to determine the points along said two light attenuating paths at which the light intensity in the path for said unknown optical signal is substantially equal to the known signal along said path for said known signal, and producing an output signal in digital form representative of the position of the point where said unknown signal is equal to said known light signal.

2. A method as defined in claim 1 wherein successive points along said path for the known signal beginning at the end next to the source of said known signal are compared with the successive points along said path for the unknown signal beginning at its end remote from the unknown signal source, and including the step of using the digital signal thus produced to increase the intensity of the known light source, and determining when substantially equal light intensities exist along said separate paths at predetermined points of comparison from which verification of proper conversion to said digital output signal is confirmed.

3. A method as defined in claim 2 including the steps of detecting substantially equal intensities at other than said predetermined points, and adding to said digital output signal values representative of the relative intensities of said known and unknown signals to increase said digital output signals, thereby to adjust the intensity of the known light source for equal intensities of said known and unknown light sources at said predetermined points, whereby said digital output signal with said values added are representative of the relative intensity of said unknown signal to said known light source.

4. A method for analog-to-digital conversion of an unknown analog signal into an electrical signal in digital form comprising the steps of comparing the unknown signal with a known analog signal from a variable source responsive to a reference signal for determining the difference therebetween, wherein said known and unknown signals are optical, using two optical conductors of substantial attenuation per unit length, one for the known optical signal and one for the unknown optical signal, and comparing the intensity of light in one conductor with the intensity of light in the other conductor at spaced points along said conductor where the comparison of one with the other at spaced points is to determine the difference in distance traversed by said optical signals in said conductors for the attenuated light signal in one to be equal to the attenuated light signal in the other, said difference in distance being a measure of the difference in optical signal intensities, and where completion of comparison is verified by said difference being equal to zero at a point of comparison of the two conductors where the known attenuation characteristics of the two conductors is known to produce a zero difference for equal intensities of light, producing an electrical signal in digital form representative of said difference, storing said difference in digital form, converting said stored difference signal in digital form to analog form to increase said reference signal by said difference, and repeating the process by algebraically adding any difference remaining in digital form to a previous sum of differences in digital form, each time storing the new sum, until any difference remaining is reduced to substantially zero, whereupon conversion is verified and said sum is representative of the intensity of said unknown source in digital form.

5. A method as defined in claim 4 wherein said known attenuation characteristics of said conductors are substantially equal, and said point of conversion verification is at a point on each conductor an equal distance from the input end thereof.

6. Apparatus for converting an unknown analog signal into an electrical signal in digital form by comparison with a known analog signal wherein said unknown and known analog signals are optical, comprising means for producing a known analog signal proportional to the amplitude of an applied analog electrical signal, means for successively comparing the value of said unknown analog signal with said known analog signal as said known analog signal is changed for determining the relative difference between the unknown analog signal and the known optical signal, said means for comparing the intensity of said unknown optical signal with said known optical signal is comprised of two elongated optical conductors, one for each optical signal to be compared, a plurality of photodetectors spaced along each conductor, a plurality of electrical signal comparators, each connected to paired photodetectors, one photodetector placed for detecting light at a point spaced along one conductor for said reference optical signal and another photodetector placed for detecting light at a point spaced along the other conductor, and means responsive to said comparators for identifying which is the first comparator connected to a photodetector spaced along said one conductor from the input end thereof shows the known optical signal equal to or greater than the unknown optical signal, means for producing electrical signals in digital form representative of said relative difference, comprised of means for encoding in digital form the relative intensity output of each comparator, means for storing electrical signals in digital form, means for converting said stored electrical signals in digital form to an analog electrical signal for application to said known analog signal means, thereby to vary said known analog signal towards equality between said unknown analog signal and said known analog signal, whereby said electrical signal in digital form is produced as a measure of the value of said unknown source, and means for algebraically adding successive electrical signals in digital form to previously stored electrical signals in digital form.

7. Apparatus as defined in claim 6 including verification means responsive to said encoding means for detecting when said digital signal representative of relative amplitude indicates a difference of substantially zero, thereby to verify that conversion of an optical analog signal to digital form has been completed.

8. Apparatus as defined in claim 7 wherein said verification means includes bistable means set to disable accumulation of digital signals representative of relative amplitudes upon verifying that completion is complete to prevent altering said accumulation of digital signals until reset upon commencing another conversion cycle.

* * * * *